(12) United States Patent
Guo

(10) Patent No.: US 6,888,763 B1
(45) Date of Patent: May 3, 2005

(54) COMPENSATED OSCILLATOR CIRCUIT FOR CHARGE PUMPS

(75) Inventor: Xin Guo, Mountain View, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 257 days.

(21) Appl. No.: 10/358,498

(22) Filed: Feb. 4, 2003

(51) Int. Cl.[7] .................................................. G11C 7/00
(52) U.S. Cl. .................. 365/189.11; 365/211; 365/226; 331/175; 331/176
(58) Field of Search ....................... 365/189.11, 189.09, 365/211, 226; 327/536, 538; 331/175, 176, 182

(56) References Cited

U.S. PATENT DOCUMENTS

| 4,851,792 | A | * | 7/1989 | Ochiai et al. ............... 331/176 |
| 5,841,725 | A | * | 11/1998 | Kang et al. .................. 365/226 |
| 6,100,748 | A | * | 8/2000 | Oh .............................. 327/526 |
| 6,240,033 | B1 | * | 5/2001 | Yang et al. .............. 365/225.7 |
| 6,535,435 | B2 | * | 3/2003 | Tanaka et al. ......... 365/189.09 |
| 6,654,296 | B2 | * | 11/2003 | Jang et al. ............. 365/189.09 |
| 6,788,577 | B2 | * | 9/2004 | Mihara .................. 365/185.18 |

* cited by examiner

Primary Examiner—Tan T. Nguyen

(57) ABSTRACT

A charge pump oscillator circuit with compensation for variations in process and operating environment. The charge pump oscillator is designed with a rolloff characteristic that enables operation at both weak and strong process corners without excessive power consumption. Composite resistors in the oscillator circuit are composed of component resistors that are fabricated with different processes, e.g., implant and deposition. The resistance of the composite resistor is thus in order to provide compensation for variations in processing and operating environment. The composite resistor may be used as a feedback loop resistor, or may be used as a source degenerate resistor to control the supply current to the oscillator.

20 Claims, 5 Drawing Sheets

COMPENSATED OSCILLATOR CIRCUIT FOR CHARGE PUMPS

TECHNICAL FIELD

The present invention relates to a non-volatile memory. Specifically, the present invention relates to a charge pump oscillator for a non-volatile memory device.

BACKGROUND ART

Many electronic devices, such as computers, personal digital assistants, cellular telephones, digital cameras and similar systems and devices include processors and memory. The memory is used to store computer programs to be executed by the device and/or data operated on by the processors to achieve the functionality of the device. Many devices and systems require that this information be retained in permanent storage non-volatile medium so that the data and computer programs is not lost when power is removed.

Flash memory (or Flash RAM) is an example of a non-volatile memory device. Flash memory devices use a memory cell transistor with a floating gate structure. The typical memory cell in a flash memory device comprises an access transistor and a storage element, such as a floating gate. Data in the flash memory device are programmed or erased by accumulation or depiction of charge, respectively, across a thin insulating film between a substrate and a storage element (e.g., floating gate). Programming of the memory cells occurs by applying a sufficient voltage difference to the transistors to cause excess electrons to accumulate on the storage element. Erasure of the memory cell is done by applying a voltage difference that causes the charge on the storage element to be extracted.

The voltages used for writing and erasing a flash memory cell are necessarily higher than those used for reading since the information (charge) stored in the cell must be stable over repeated read operations, time and temperature. Typical write and erase voltages are greater than the general supply voltages used by modern microprocessors, volatile memories and transistor—transistor-logic (TTL). When the voltage used for write and erase is also required by other components in a system, the provision of an external voltage source is not an additional cost of using a flash memory. However, when the write and erase voltage is not required by another component, the addition of an internal voltage converter to the flash memory device becomes attractive in order to avoid adding another system voltage source that is useful only to the flash memory. This is particularly true for battery-powered devices with incorporated flash memory.

A common type of voltage converter is the charge pump. Charge pumps are well suited to integration on a semiconductor substrate since they do not require inductors. Charge pumps are usually implemented as an array of capacitors coupled by switches. The capacitor array is driven by a switched low voltage DC source to produce a multiplied DC output. The switching elements are usually diodes or transistors. Examples of charge pumps are the Cockcroft-Walton multiplier and Dickson charge pump.

A conventional charge pump used in a flash memory device is driven by an oscillator circuit that is designed to produce a stable frequency output that is relatively unaffected by normal variations within the specified temperature and supply voltage ranges. The charge pump is also designed to provide a minimum at a slow process corner, that is a worst case scenario for the process variations that may occur during fabrication of the device.

There are many variables that may be involved in determining a process corner. Examples are junction doping profile (hard or soft), gate oxide (thin or thick), contact resistance (high or low), and gate length (long or short). Each of these variables has an impact on the overall performance of a circuit. A hard (abrupt) junction doping profile, thin gate oxide, low contact resistance and a short gate contribute to a fast process, whereas a soft junction doping profile, thick gate oxide, high contact resistance and a long gate contribute to a slow process.

Although a charge pump oscillator may be designed for a slow process corner and worst case operating conditions (e.g., low supply voltage and high temperature), the fabricated device is usually better than worst case, and is used under operating conditions that are not extreme. The result of having a "better than expected" device operating under mild or favorable conditions is that the output of a flat oscillator exceeds that required to meet the performance specifications of the flash memory as a whole, and power is wasted. What is needed is an oscillator that is capable of producing a uniform power dissipation in a flash memory device over a range of process and operating environment variables.

DISCLOSURE OF THE INVENTION

A charge pump oscillator circuit with compensation for variations in process and operating environment is disclosed. The charge pump oscillator is designed with a rolloff characteristic that enables operation at both weak and strong process corners without excessive power consumption. Composite resistors in the oscillator circuit are fabricated with implant and deposition processes in order to provide compensation for variations in processing and operating environment.

In an embodiment of the present invention, a flash memory device is provided with an oscillator circuit that has a rolloff characteristic with respect to frequency output as a function of the relative collective strength or weakness of process and environmental variables. The oscillator rolloff characteristic is achieved by using composite resistors in the oscillator circuit. The composite resistors comprise component resistors that are fabricate d using different processes. The overall characteristic of the composite resistor is a function of the resistance functions of the individual component resistors, and thus provides greater flexibility than a resistor fabricated with single process.

In another embodiment of the present invention, a Schmitt trigger using complementary transistors is used as the core of an oscillator circuit. A pair of source degenerate resistors couples the Schmitt trigger to a supply voltage $V_{cc}$, and to ground. A feedback loop resistor couples the output of the Schmitt trigger oscillator to its input. Each composite resistor comprises an N-well resistor in series with a polysilicon resistor. The N-well resistor has a positive temperature coefficient of resistance, and the polysilicon resistor has a negative temperature coefficient of resistance.

BRIEF DESCRIPTION OF THE DRAWINGS

Prior Art

Prior Art

BEST MODE FOR CARRYING OUT THE INVENTION

Reference will now be made in detail to the preferred embodiments of the present invention, a compensated oscillator circuit for charge pumps. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Figure 1:
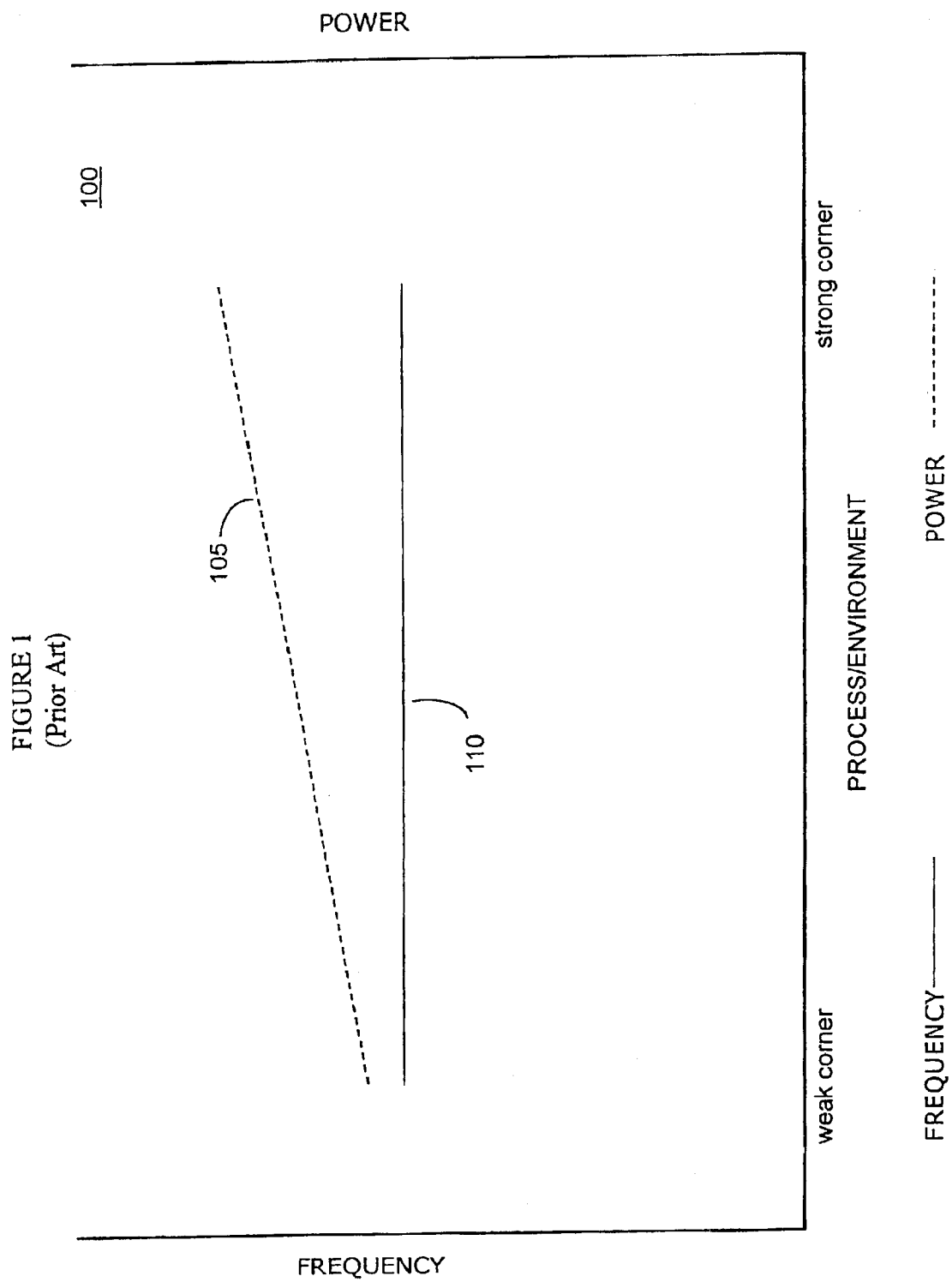
FIG. 1 shows a diagram of a conventional charge pump oscillator frequency response and overall circuit power consumption in relation to process and operating environment variations.

Prior Art FIG. 1 shows a diagram of a conventional charge pump oscillator frequency response 110 and overall circuit power consumption 105 in relation to process and operating environment variations. Typical oscillator circuit design emphasizes a flat and stable frequency response 110 over a wide range of process variables and operating conditions. Supply voltage ($V_{cc}$) and temperature are generally the most influential environmental variables. Process variables include junction doping profile, gate oxide, contact resistance, and gate (channel) length. A combination of these variables that produces weak performance in a device is referred to as a "weak corner" and a combination of these variables that produces strong performance is referred to as a strong corner.

The power dissipation 105 shown in FIG. 1 reflects the power dissipation of a conventional flash memory device. The power dissipation in the memory device is the sum of many contributions. In addition to the oscillator/charge pump, memory cells, row and column decoders, and other circuits are involved in a write or erase operation. Variations in process and operating environment are shared by all of the circuits in a flash memory device, and although an oscillator may be designed to provide a flat frequency response with respect to process/environment variables, the overall performance of a flash memory device typically shows a higher power consumption 105 at a strong corner as compared to a weak corner. Under favorable conditions, the oscillator will deliver more current than is delivered under the worst case, and the additional power is essentially wasted.

A straightforward example of the impact of an operating environment variable is the individual effect of a high $V_{cc}$. A flash memory device having an oscillator with a flat frequency response over the specified operating range for Vcc will deliver an increasing current with an increasing $V_{cc}$. In practice, there is a complex multi-dimensional interaction between the environmental and process variables. This interaction includes both offsetting and augmenting effects that contribute to the spectrum shown schematically in the two-dimensional diagram of FIG. 1. Most devices are fabricated with process variables that are better than the worst case that they are designed for, and thus have an inherent amount of waste built in. When a device with good processing is operated at a high $V_{cc}$ and low or moderate temperature, the waste is compounded.

Figure 2:
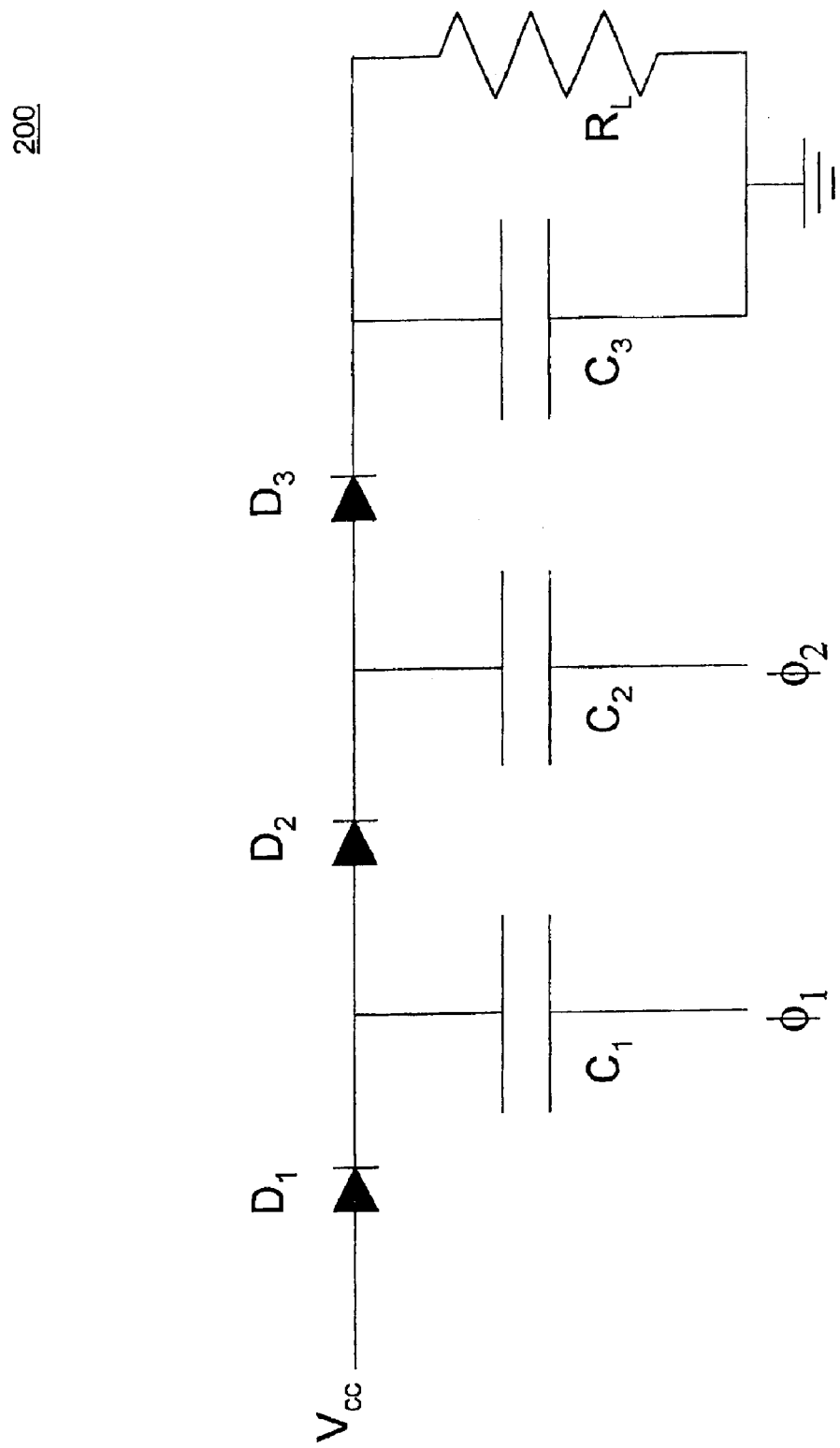
FIG. 2 shows a schematic for a typical charge pump voltage multiplier circuit.

FIG. 2 shows a circuit schematic 200 for a Dickson charge pump. The circuit 200 has two clock inputs $\phi_1$ and $\phi_2$ that are typically driven by two oscillator circuits that are anti-phase. Diodes $D_1$ and $D_2$, act as self-timed switches that successively charge capacitors $C_1$, $C_2$. Capacitor $C_3$ serves to filter the output that is provided to the load $R_L$. The switching diodes of FIG. 2 may be implemented as gate connected transistors, as is commonly done with complementary metal oxide semiconductor (CMOS) technology. Alternatively, a charge pump may use precisely timed transistors as switches in order to avoid the forward voltage drop associated with diodes. There are many varieties of charge pumps that can be generalized as comprising a switched array of capacitors driven by an oscillator.

Figure 3A:
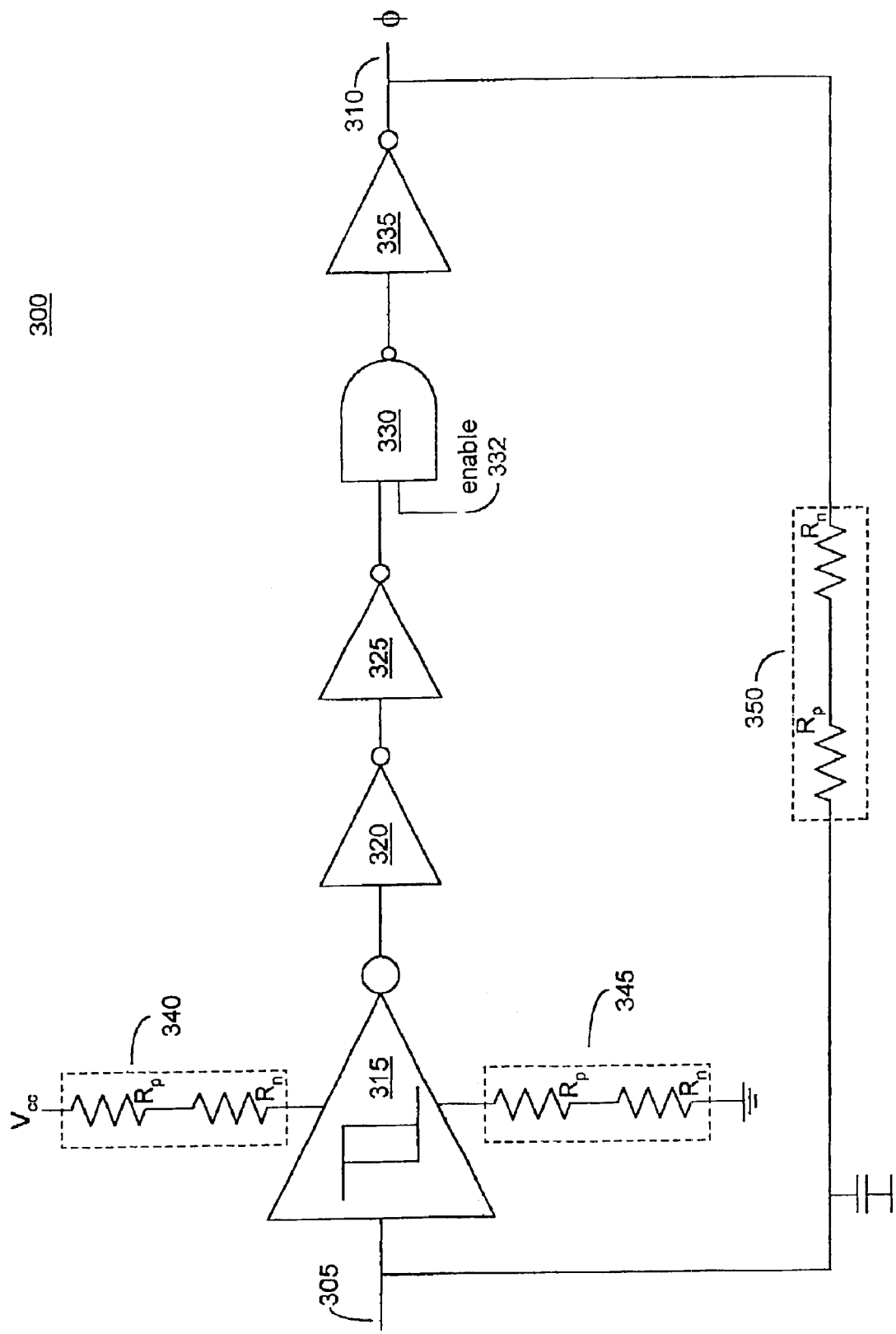
FIG. 3A shows a compensated oscillator circuit based on a Schmitt trigger with composite resistors in accordance with an embodiment of the present claimed invention.

FIG. 3A shows an example of a compensated oscillator circuit 300 in accordance with an embodiment of the present claimed invention. The oscillator circuit 300 is based upon a Schmitt trigger 315, comprising a clock input 305, and has its output coupled to inverters 320, 325, NAND gate 330 (with input 332 used to enable the oscillator), and inverter 335. The output $\phi$310 of the oscillator 300 is taken at the output of inverter 335. Composite feedback loop resistor 350 couples the output 310 to the input 305. Composite source degenerate resistor 340 couples the Schmitt trigger 315 to a supply voltage $V_{cc}$ and composite source degenerate resistor 345 couples the Schmitt trigger 315 to ground.

Figure 3B:
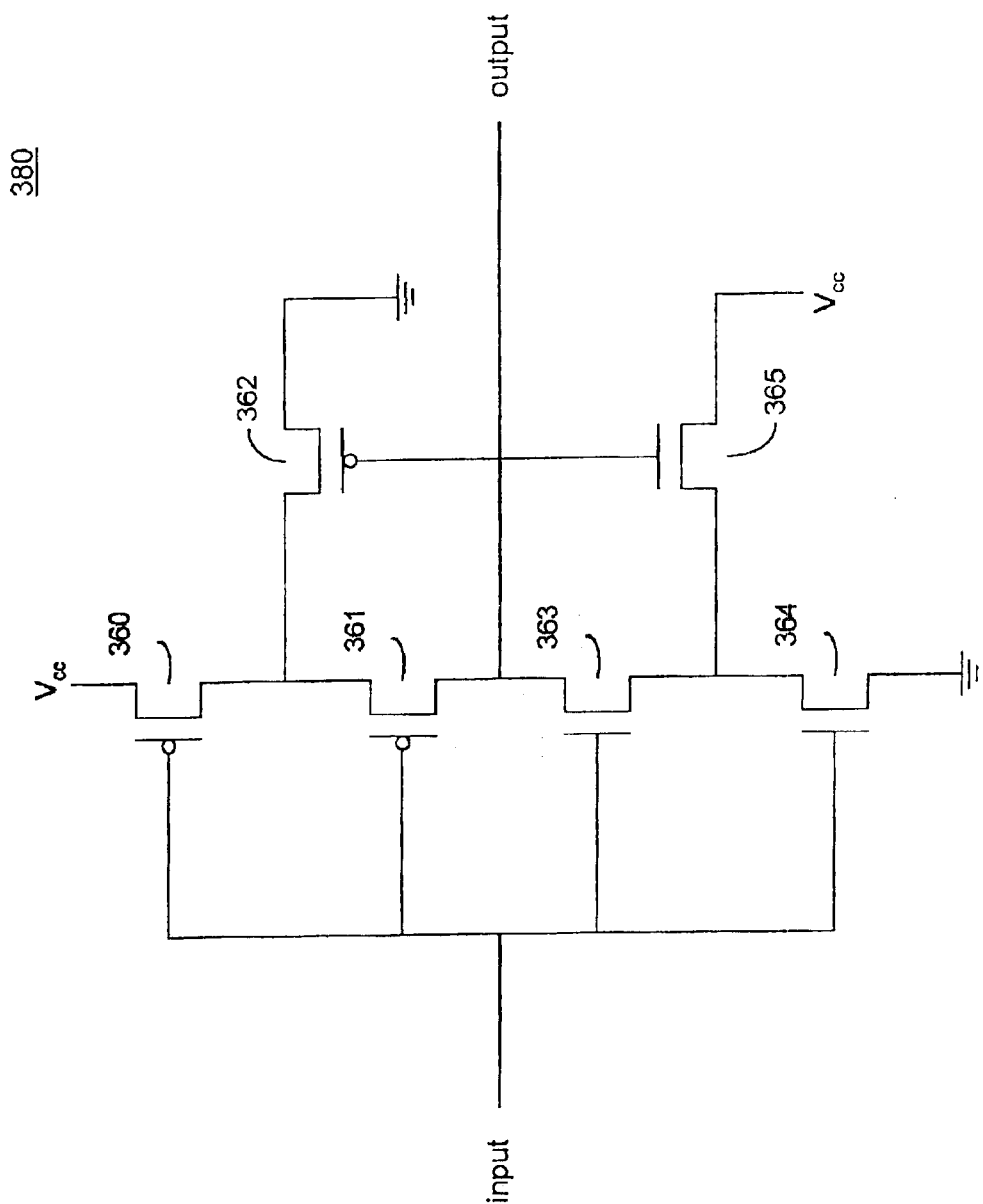
FIG. 3B shows a schematic for the Schmitt trigger of FIG. 3A in accordance with an embodiment of the present claimed invention.

FIG. 3B shows a circuit schematic 380 of the Schmitt trigger 315 of FIG. 3A. The circuit comprises four stacked transistors (360, 361, 363 and 364) and source follower transistors 362 and 365. Transistors 360, 361 and 362 are p-channel devices, whereas transistors 363, 364 and 365 are n-channel devices. The circuit 380 is well suited to implementation using a CMOS process.

Referring again to FIG. 3A, it is important to note that composite resistors 340, 345, and 350 each comprise a resistor $R_p$ and a resistor $R_o$. In this specific example, $R_p$ is a resistor fabricated from deposited polysilicon, and $R_o$ is a resistor fabricated implanting a substrate (e.g. an n-well). A conventional fabrication process used to create resistors in an oscillator circuit will use a single process for fabricating resistors in order to simplify the overall process. In the present invention, a more complex composite resistor is adopted in order to provide additional degree of freedom that may be applied to the oscillator design for purposes of overall circuit compensation. A composite resistor is defined as a resistor comprising at least two component resistors, wherein the component resistors are fabricated by different processes.

Although an individual resistor having a positive or negative thermal coefficent of resistance (TCR) may be fabricated using an n-well implant or polysilicon deposition, respectively, the achievable slope of the resistance function versus temperature will be constrained by doping concentration. Since the process used to fabricate a resistor is not typically designed exclusively for the resistor, the sheet resistance is usually not selectable, and the desired resistor value is obtained by adjusting layout geometry. The layout geometry is in turn constrained by available space. In the design of a conventional oscillator, a flat response may be obtained by using a single process. However, optimizing the performance of a flash memory device as a whole by tailoring a response rolloff of the oscillator is a difficult task within the constraints described above. The composite resistor of the present invention provides an additional degree of freedom that greatly enhances the optimization of overall power consumption through oscillator compensation.

The conventional limitation on the slope of the TCR is removed by the series combination of $R_n$ and $R_p$. In the general case, a composite resistor comprises at least two resistors, each fabricated using a different process. Although the present example refers to an implant process and a deposition process, other combinations may be used (e.g., two implants with different doping concentrations). For a series combination of component resistors, the TCR of the composite resistor is a weighted sum of the TCR of each of the individual resistors. Thus the weighted sum of resistor having a positive TCR and a resistor having a negative TCR may be used to produce a TCR range that is much greater than the individual ranges.

The composite resistors 340, 345, and 350 may each comprise an $R_o$ and $R_p$ with unique values. For example composite resistor 340 may be designed to compensate for variations in the on resistance ($R_{ds}$ on) of the p-channel transistors shown in FIG. 3A, whereas composite resistor 345 may be designed to compensate for the resistance $R_{ds}$ on of the n-channel transistors. Thus, resistor 340 would have different values for $R_p$ and $R_d$ than resistor 345. The source degenerate resistors 340 and 345 form a voltage divider with the $R_{ds}$ of the transistors with which they share current. Thus, the TCR of the degenerate source resistors can be adjusted to compensate for changes in the drain-source voltage and current of the transistors that are due to the dependence of $R_{ds}$ on temperature. Similarly, the feedback loop resistor 350 may require a particular attenuation and a particular TCR slope. Again, this may be obtained by a unique combination of $R_p$ and $R_q$. For most flash memory devices, the maximum temperature range of interest is from +100° C. to −40° C. The typical range of interest is from +100° C. to +25° C.

It is preferred that the composite resistor be fabricated by selecting from process steps used for fabrication of the transistors or other circuit elements, so that additional process steps do not have to be added. By using existing process steps, the overhead involved in using the composite resistors is limited to mask design. Although each component ($R_p$, $R_n$) of the composite resistor is typically fabricated using a single process, processes may be combined to produce a component resistor (e.g., secondary implant, or implant of polysilicon).

TABLE 1

Oscillator Period Comparison

| Pump Oscillator | $V_{CC}$ | Temp (C.) | Present Invention $T_{period}$ (ns) | Conventional $T_{period}$ (ns) |
|---|---|---|---|---|
| Process Corner | | | | |
| sn, sp, fast | 2 | −40 | 46.5 | 38.1 |
| | 1.8 | 25 | 41.3 | 36.4 |
| | 1.6 | 100 | 39.5 | 36.9 |
| wn, sp, fast | 2 | −40 | 48.5 | 38.1 |
| | 1.8 | 25 | 43.0 | 36.2 |
| | 1.6 | 100 | 40.7 | 36.7 |
| sn, wp, fast | 2 | −40 | 47.0 | 39.5 |
| | 1.8 | 25 | 41.9 | 37.9 |
| | 1.6 | 100 | 40.5 | 38.9 |

TABLE 1-continued

Oscillator Period Comparison

| Pump Oscillator | $V_{CC}$ | Temp (C.) | Present Invention $T_{period}$ (ns) | Conventional $T_{period}$ (ns) |
|---|---|---|---|---|
| lmin, fast | 2 | −40 | 49.2 | 39.2 |
| | 1.8 | 25 | 43.6 | 37.4 |
| | 1.6 | 100 | 41.6 | 38.3 |
| typical | 2 | −40 | 44.6 | 37.4 |
| | 1.8 | 25 | 39.8 | 35.8 |
| | 1.6 | 100 | 38.3 | 36.7 |
| lmax, slow | 2 | −40 | 36.5 | 35.9 |
| | 1.8 | 25 | 35.0 | 35.0 |
| | 1.6 | 100 | 35.4 | 36.1 |
| sn, wp, slow | 2 | −40 | 34.8 | 36.3 |
| | 1.8 | 25 | 33.8 | 35.7 |
| | 1.6 | 100 | 34.6 | 37.5 |
| wn, sp, slow | 2 | −40 | 38.3 | 35.5 |
| | 1.8 | 25 | 36.2 | 34.4 |
| | 1.6 | 100 | 36.1 | 34.9 |
| wn, wp, slow | 2 | −40 | 36.0 | 36.3 |
| | 1.8 | 25 | 35.2 | 35.8 |
| | 1.6 | 100 | 36.4 | 37.6 |

Table 1 shows a comparison between a conventional, non-compensated oscillator, and the compensated oscillator of the present invention. The nomenclature used to describe variables of the process corner are as follows: ns=strong n-channel transistor (abrupt junction), sp=strong p-channel transistor (abrupt junction), fast=thin oxide, $l_{min}$=short gate (channel) length, $l_{max}$=long gate (channel) length, slow= thick oxide, wp=weak p-channel transistor (gradual junction), and wn=weak n-channel transistor (gradual junction). The "typical" process corner refers to the typical device as fabricated. The period ($T_{period}$) is compared for a conventional oscillator and an example of an oscillator of the present invention for combinations of process corner, chip supply voltage ($V_{cc}$), and temperature.

As shown in Table 1, the conventional oscillator shows an essentially flat response, whereas the oscillator of the present invention shows a distinct rolloff. For example, a comparison of process corner (wn,wp,slow) to process corner (sn, sp,fast) at Vcc=2 and Temp=−40 shows an increase in $T_{period}$ from 36.0 ns to 46.5 ns (29%) for the present invention, whereas the conventional oscillator is relatively flat, with an increase from 36.3 ns to 38.1 ns (5%). Overall, for the variable combinations shown, the maximum range for the period of the conventional oscillator is from 34.4 ns to 39.5 ns. In contrast, the period of the oscillator of the present invention ranges from 33.8 ns to 39.5 ns. It should be noted that the lower end of each range is relatively close in value, show the ability of each oscillator to meet the requirements at a slow process corner. However, the upper limits of the respective ranges diverge due to the rolloff characteristic of the present invention.

As shown in Table 1, n-channel and p-channel transistors may be weak or strong independently. For oscillators with complementary transistors, the makeup of a composite transistor coupled to an n-channel transistor may be different than one used with a p-channel transistor. Component resistors for a composite resistor may be fabricated with multiple implants of either p-type or n-type.

Table 2 below shows a comparison between current drain of a flash memory device of the present invention with a conventional flash memory device. As can be seen, the difference in current drain between fast and slow process corners is significantly lower using the new oscillator, as compared to the conventional oscillator.

TABLE 2

Current Drain Comparison

| | $I_{CC}$ active | |
| Corner | Present invention | conventional |
| --- | --- | --- |
| Fast | 28.6 mA | 36.9 mA |
| Typical | 25.7 mA | 31.2 mA |
| Slow | 24.8 mA | 25.1 mA |

Figure 4:
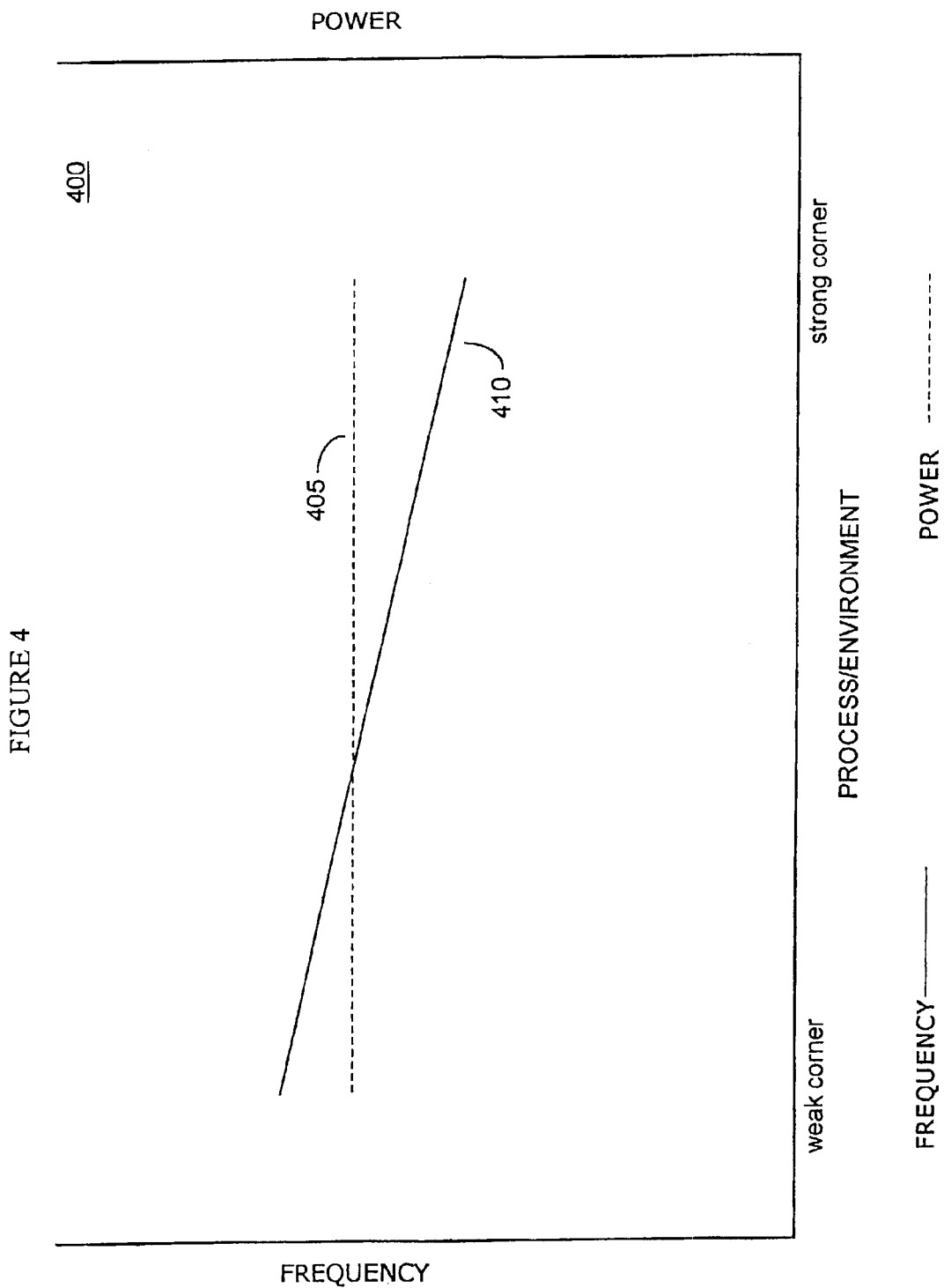
FIG. 4 shows a diagram of the frequency response and overall circuit power consumption in relation to process and operating environment variations in accordance with an embodiment of the present claimed invention.

FIG. 4 shows a diagram 400 of the frequency response 410 and overall circuit power consumption 405 in relation to process and operating environment variations in accordance with an embodiment of the present claimed invention. The rolloff characteristic shown in the frequency response 410 produces a flat overall power consumption as compared to the conventional frequency response and power consumption of FIG. 1. It should be kept in mind that the diagrams of FIG. 1 and FIG. 4 are schematic representations of frequency response and power dissipation. The slopes of the straight lines shown are meant to convey general trends between weak and strong corners, and are not meant imply a linear function. This is particularly true of FIG. 4.

Although the composite resistors shown in FIG. 3A are comprised of component resistors connected in series, parallel combinations of component resistors may also be used. The use of serial and parallel connections between component resistors having negative and positive TCRs provides additional flexibility in tailoring the response of the charge pump oscillator.

While the present invention of a compensated oscillator circuit for charge pumps has been described in particular embodiments, it should be appreciated that the present invention should not be construed as limited by such embodiments, but rather construed according to the below claims.

What is claimed is:

1. A charge pump circuit for a non-volatile memory integrated circuit comprising an oscillator circuit, wherein said oscillator circuit comprises a composite resistor to provide compensation for fabrication process variations and variations in an operational environment.

2. The charge pump circuit of claim 1, wherein said oscillator circuit comprises at least one transistor coupled to a supply voltage ($V_{cc}$) by said composite resistor.

3. The charge pump circuit of claim 2, wherein said composite resistor comprises a first resistor having a positive temperature coefficient of resistance and second resistor having a negative temperature coefficient of resistance.

4. The charge pump circuit of claim 2, wherein said oscillator comprises a complementary transistor coupled to ground by said composite resistor.

5. The charge pump circuit of claim 2, wherein the ratio between the value of the composite resistor to a value of an on resistance of said transistor increases with decreasing temperature over the temperature range of +100° C. to −40° C.

6. The charge pump circuit of claim 5, wherein the ratio between the value of the composite resistor to a value of an on resistance of said transistor increases with decreasing temperature over the temperature range of +100° C. to +25° C.

7. The charge pump circuit of claim 2, wherein said composite resistor comprises a first implanted resistor and a second deposited resistor.

8. The charge pump circuit of claim 7, wherein said first resistor is an n-well resistor and said second resistor is a polysilicon resistor.

9. The charge pump circuit of claim 1, wherein said oscillator circuit comprises a Schmitt trigger.

10. The charge pump circuit of claim 9, wherein said oscillator circuit comprises a composite source degenerate resistor and a composite feedback loop resistor.

11. A flash memory device comprising:

an array of capacitors coupled by switches;

an oscillator circuit coupled to said array of capacitors, said oscillator circuit comprising a first resistor having a positive temperature coefficient of resistance, and a second resistor having a negative temperature coefficient of resistance.

12. The flash memory device of claim 11, wherein said first resistor and said second resistor are connected in series.

13. The flash memory device of claim 12 wherein the net temperature coefficient of resistance is positive.

14. The flash memory device of claim 12, wherein said first resistor and said second resistor are coupled to an input and an output of said oscillator circuit to provide a feedback current.

15. The flash memory device of claim 14, wherein said implanted resistor is an n-well resistor.

16. The flash memory device of claim 15, further comprising a feedback loop resistor and a source degenerate resistor.

17. The flash memory device of claim 14, wherein said deposited resistor is a polysilicon resistor.

18. The flash memory device of claim 12, wherein said oscillator circuit comprises a transistor coupled to one of said first resistor and said second resistor.

19. The flash memory device of claim 11, wherein one of said first and second resistors is an implanted resistor and one of said first and second resistors is a deposited resistor.

20. The flash memory device of claim 11, wherein said oscillator comprises a Schmitt trigger.

* * * * *